(12) United States Patent
Noda (10) Patent No.: US 7,518,096 B2
(45) Date of Patent: Apr. 14, 2009

(54) METHOD OF DESIGNING PHOTOELECTRIC CONVERSION APPARATUS WITH CAREFULLY SET ANTIREFLECTIVE FILM THICKNESS

(75) Inventor: Tomoyuki Noda, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 393 days.

(21) Appl. No.: 10/986,945

(22) Filed: Nov. 15, 2004

(65) Prior Publication Data

US 2005/0110002 A1  May 26, 2005

(30) Foreign Application Priority Data

Nov. 25, 2003  (JP) .............................. 2003-393978

(51) Int. Cl.
  *H01L 31/00* (2006.01)
(52) U.S. Cl. ................. 250/214.1; 250/226; 250/208.1; 438/72; 257/437
(58) Field of Classification Search ................. 257/437; 438/72; 250/214.1
  See application file for complete search history.

(56) References Cited

U.S. PATENT DOCUMENTS

| | | | | |
|---|---|---|---|---|
| 5,724,182 | A * | 3/1998 | Mitani et al. ................. | 359/457 |
| 6,147,390 | A * | 11/2000 | Nakano et al. ............... | 257/437 |
| 6,166,405 | A | 12/2000 | Kuriyama et al. ............ | 257/290 |
| 6,614,479 | B1 | 9/2003 | Fukusho et al. ............. | 348/340 |
| 6,884,702 | B2 * | 4/2005 | Wei et al. .................... | 438/514 |
| 6,958,748 | B1 * | 10/2005 | Fukui et al. ................. | 345/173 |
| 2002/0127481 | A1 * | 9/2002 | Chen et al. ................... | 430/7 |
| 2003/0178618 | A1 | 9/2003 | Murakami .................... | 257/21 |
| 2004/0012707 | A1 | 1/2004 | Fukusho et al. ............. | 348/340 |
| 2004/0209411 | A1 * | 10/2004 | Fisher et al. ................. | 438/197 |
| 2005/0001231 | A1 * | 1/2005 | Hayashida et al. .......... | 257/101 |

FOREIGN PATENT DOCUMENTS

JP  4-206571  7/1992

(Continued)

OTHER PUBLICATIONS

Wilson, S.R.; Tracy, C.J.; Freeman, J.L., Jr. (1993). Handbook of Multilevel Metallization for Integrated Circuits—Materials, Technology, and Applications. (pp. 262-264). William Andrew Publishing/Noyes. Online version available at: http://www.knovel.com/knovel2/Toc.jsp?BookID=576&VerticalID=0.*

Primary Examiner—Seung C Sohn
(74) Attorney, Agent, or Firm—Fitzpatrick, Cella, Harper & Scinto (57) ABSTRACT

It is a main object of the present invention to suppress the differences of color ratios of B/G and R/G when the film thicknesses of antireflective films and insulation films vary at a processing process. The present invention is a photoelectric conversion apparatus including a plurality of light receiving portions arranged on a semiconductor substrate, antireflective films formed on the light receiving portions with insulation films put between them, and color filter layers of a plurality of colors formed on the antireflective films, wherein film thicknesses of the insulation films and/or the antireflective films are changed such that changing directions of spectral transmittances at peak wavelengths of color filters on sides of the shortest wavelengths and at peak wavelengths of color filters on sides of the longest wavelengths after transmission of infrared cutting filters may be the same before and after changes.

4 Claims, 7 Drawing Sheets

FOREIGN PATENT DOCUMENTS

| | | |
|---|---|---|
| JP | 4-206571 A | 7/1992 |
| JP | 11-103037 | 4/1997 |
| JP | 11-103037 A | 4/1999 |
| JP | 2000-12822 A | 1/2000 |
| JP | 2001-352051 | 12/2001 |
| JP | 2001-352051 A | 12/2001 |
| JP | 2003-229562 | 8/2003 |
| JP | 2003-229562 A | 8/2003 |

\* cited by examiner

● SiN/SiO=40nm/10nm (SiO VARIATION WITHIN ±10%)

METHOD OF DESIGNING PHOTOELECTRIC CONVERSION APPARATUS WITH CAREFULLY SET ANTIREFLECTIVE FILM THICKNESS

CROSS REFERENCE TO RELATED APPLICATION

This application claims priority from Japanese Patent Application No. 2003-393978 filed on Nov. 25, 2003, which is hereby incorporated by reference.

BACKGROUND OF THE INVENTION

1. Field of the Invention

The present invention relates to a photoelectric conversion apparatus and an image pickup system, and more particularly to a photoelectric conversion apparatus and an image pickup system both of which include a plurality of light receiving portions arrange on a semiconductor substrate, an antireflective film formed above the light receiving portions with an insulation film put between them, and color filter layers of a plurality of colors formed on the antireflective film.

2. Description of Related Art

As a solid state image pickup device, a charge coupled device (CCD) type photoelectric conversion element has conventionally been used in many cases. However, a complementary metal oxide semiconductor (CMOS) type photoelectric conversion element has been reconsidered recently, and a trend of commercialization of product of the CMOS type photoelectric conversion element has been generated owing to the merits of the CMOS type photoelectric conversion element such as its power consumption lower than that of the CCD type photoelectric conversion element, its operability of the use of a single power supply, and its producibility of its light receiving portion and its peripheral circuits by the same CMOS process, which makes it easy to integrate the CMOS type photoelectric conversion element.

Figure 9:
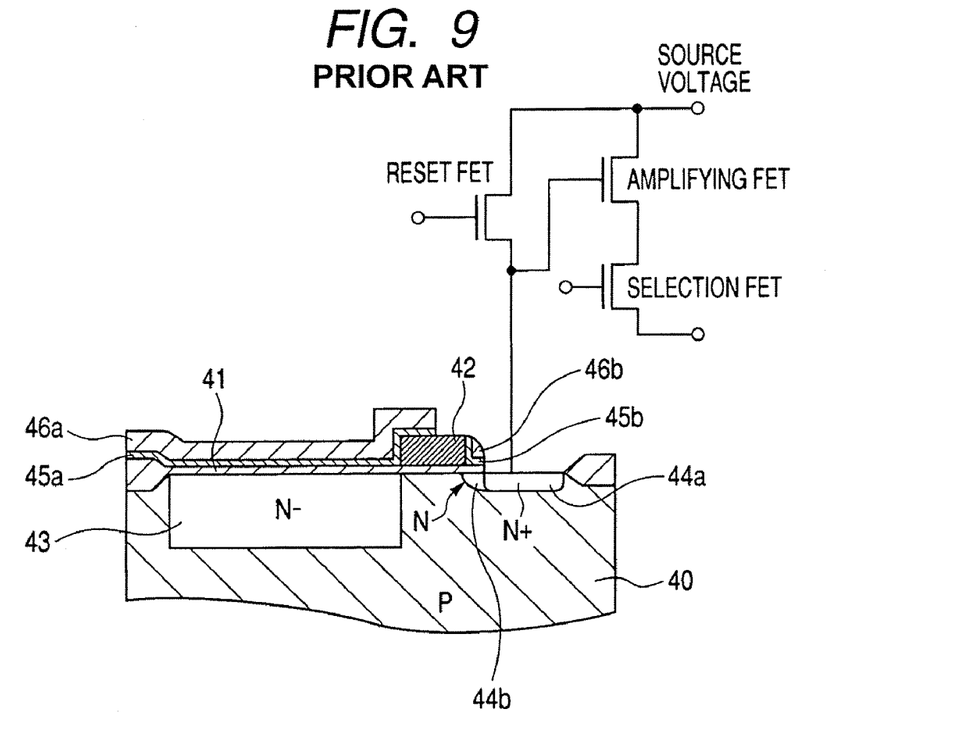
FIG. 9 is a schematic sectional view showing a conventional solid state image pickup apparatus.

As the configuration of a conventional solid state image pickup device, for example, there is one proposed in Japanese Patent Application Laid-Open No. 2000-12822. An example of the pixel configuration of the disclosed metal oxide semiconductor (MOS) type solid state image pickup device is shown in FIG. 9. The MOS type solid state image pickup device shown in FIG. 9 is a solid state image pickup device adopting a method in which signal charges are transferred from light receiving portions to detection portions to output potential changes generated by the detection portions. Each pixel of the MOS type solid state image pickup device is composed of a light receiving portion and four transistors of a transfer transistor, an amplifying transistor, a reset transistor and a selection transistor. The transfer transistor is a MOS transistor composed of a light receiving portion 43, a detection portion 44a, both of which are n type diffusion regions formed in a p type silicon substrate 40, and a transfer gate electrode 42 formed above the silicon substrate between both the regions with an insulation film 41 put between the transfer gate electrode 42 and the silicon substrate. The transfer transistor uses the light receiving portion 43 and the detection portion 44a as its source and its drain, respectively.

An antireflective film 45a is formed above the light receiving portion 43 with the insulation film 41 put between them. In such a configuration, by the interference caused by the antireflective film 45a (silicon nitride film) and the insulation film (silicon oxide film) 41, and by the interference caused by the films including the above-mentioned two films and an interlayer insulation film formed above the two films, the reflection of light at an interface between the silicon and the silicon oxide film is suppressed to enable the sensitivity to be improved. A reference numeral 46a denotes an insulation film (silicon oxide film); a reference numeral 44b denotes an electric field relief region; reference numerals 45b and 46b denote side insulation films (silicon nitride film and silicon oxide film).

SUMMARY OF THE INVENTION

However, the present inventor found that there was a problem that the variation of the film thicknesses of the antireflective films and the variation of the film thicknesses of the insulation films were produced owing to the variation of the film thicknesses at processing processes and the light transmittance changes according to wavelengths to produce the differences of color ratios of B/G and R/G in the case where a color filter is formed on the antireflective film of the configuration of the above-mentioned Japanese Patent Application Laid-Open No. 2000-12822.

It is an object of the present invention to propose a designing technique of an antireflective film in which no differences of the color ratios of B/G and R/G are produced to realize a photoelectric conversion apparatus having a good color reproducibility even when the film thicknesses of antireflective films and insulation films vary at processing processes.

For achieving the above-mentioned object, the present invention is a photoelectric conversion apparatus including a plurality of light receiving portions arranged on a semiconductor substrate, antireflective films formed on the light receiving portions, and color filter layers of a plurality of colors formed on the antireflective films, wherein film thicknesses of the antireflective films are changed such that changing directions of spectral transmittances at peak wavelengths of color filters on sides of the shortest wavelengths and at peak wavelengths of color filters on sides of the longest wavelengths after transmission of infrared cutting filters may be the same before and after changes.

Moreover, the present invention is a photoelectric conversion apparatus including a plurality of light receiving portions arranged on a semiconductor substrate, antireflective films formed on the light receiving portions, and color filter layers of a plurality of colors, the color filter layers formed on the antireflective films, wherein the antireflective films are severally made of a silicon nitride film having a film thickness within a range from 25 nm to 40 nm, and silicon oxide films each having a film thickness of 8 nm or less are formed between the light receiving portions and the antireflective films.

Moreover, the present invention is a photoelectric conversion apparatus including a plurality of light receiving portions arranged on a semiconductor substrate, antireflective films formed on the light receiving portions, and color filter layers of a plurality of colors, the color filter layers formed on the antireflective films, wherein the antireflective films are severally made of a silicon oxynitride film having a film thickness within a range from 40 nm to 60 nm, and silicon oxide films each having a film thickness of 8 nm or less are formed between the light receiving portions and the antireflective films.

In the present invention, the antireflective films are films for suppressing reflection on a substrate surface, which reflection is caused by a difference of refractive indices of the substrate and the insulation films, and the antireflective films are films for suppressing reflection on a substrate surface, which reflection is caused by a difference of refractive indices of the substrate and the antireflective films, in the case where the insulation films are not formed between the antireflective films and the substrate.

According to the present invention, no differences of color ratios between B/G and R/G are produced even when film thicknesses of antireflective films and insulation films vary at processing processes, and a photoelectric conversion apparatus having a good color reproducibility can be realized.

DESCRIPTION OF THE PREFERRED EMBODIMENTS

In the following, the attached drawings are referred to while the preferred embodiments of the present invention are described.

Figure 10:
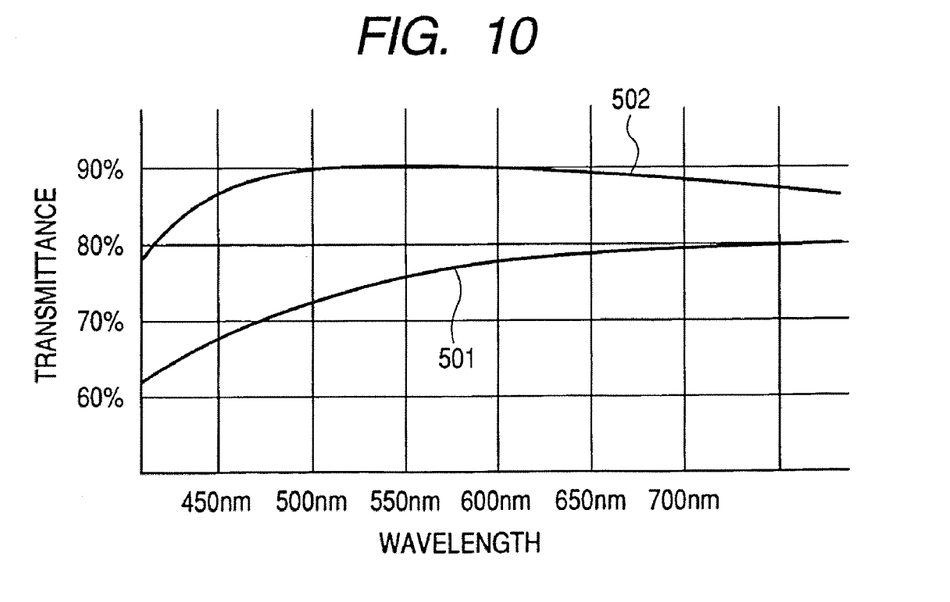
FIG. 10 is a diagram showing an example of a designing technique according to a conventional antireflective film.

First, the circumstances of the achievement of the present invention are described. An example of the conventional designing technique of the film thicknesses of an insulation film and an antireflective film is shown in FIG. 10. The ordinate axis of the graph is transmittance (%), and the abscissas axis of the graph is wavelength (μm). The diagram shows how much of the incident light of each wavelength is transmitted to reach a light receiving portion. A reference numeral 501 denotes a spectral characteristic in case of no antireflective films are used, and a reference numeral 502 denotes a spectral characteristic after designing the optimal value of the antireflective film.

In the conventional designing technique, designing has been performed to adopt a combination of the thicknesses of the antireflective film 45a and the insulation film 41 in order to show the characteristic which is denoted by the reference numeral 502 in FIG. 10 and is one in which the transmittance (sensitivity) of the wavelength takes the maximum value at the center (near to green). The reason why the conventional designing technique has taken the designing is that the rise of the sensitivity at the central frequency (near to green) would raise the sensitivities at the short wavelength side (near to blue) and the long wavelength side (near to red) at the same time.

The present inventor found the following fact. That is to say, when the antireflective films 45a and the insulation films 41 are manufactured by the above-mentioned designing technique, the variations of the film thicknesses of the antireflective films 45a and the insulation films 41 are produced owing to the unevenness of etching at the time of etching a gate oxide film and the unevenness of deposition at the time of depositing the antireflective film in the processing processes. The differences of color ratios of B/G and R/G become large owing to the variations of the film thicknesses, and then the color reproducibility of sensors becomes bad.

Table 1 shows variations of color ratios of by the conventional technique osing that B=450 nm, G=550 nm standard deviation value of ten chips extracted randomly is expressed by σ. According to the conventional technique, the variation of B/G is 4.28% at the time of being expressed by the σ, and the variation of R/G is 4.83% at the time of being expressed by the σ.

TABLE 1

| CHIP | B/G | R/G |
|---|---|---|
| 1 | 1.02 | 0.95 |
| 2 | 1.05 | 0.94 |
| 3 | 1.05 | 0.96 |
| 4 | 0.97 | 1.03 |
| 5 | 1.04 | 0.99 |
| 6 | 1.08 | 0.94 |
| 7 | 0.98 | 1.06 |
| 8 | 1.01 | 1 |
| 9 | 0.95 | 1.04 |
| 10 | 1.06 | 0.92 |
| σ | 0.0428 | 0.0483 |

Figure 11:
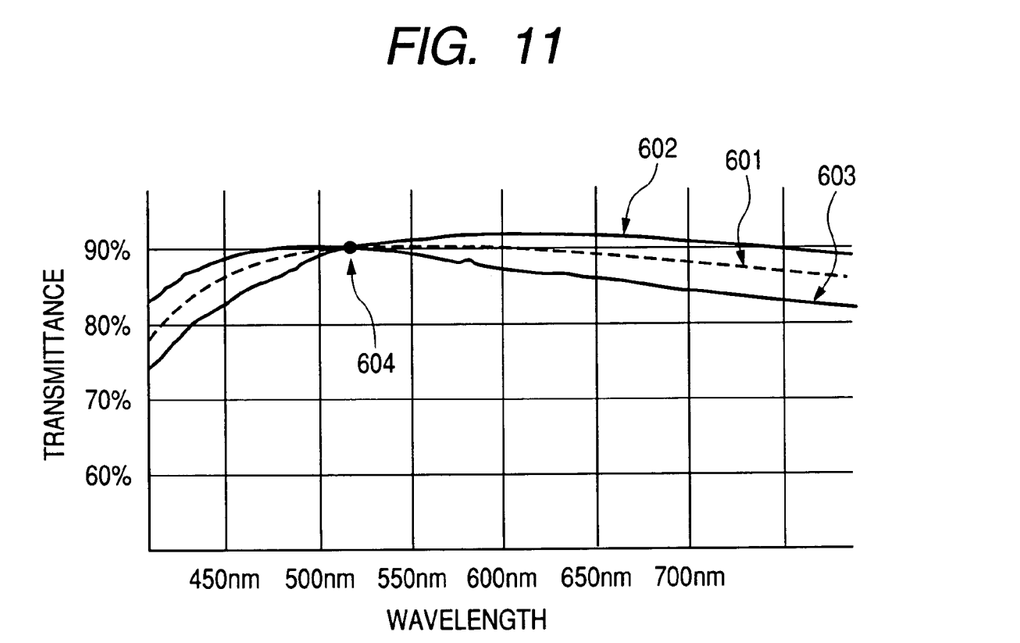
FIG. 11 is a diagram showing a principle of the increase of color variations in a conventional example.

FIG. 11 shows the principle of the enlargement of the variations. A dotted line 601 indicates a spectral characteristic at the time of designing the antireflective film to have the optimum value. A solid line 602 indicates a spectral characteristic at the time when the antireflective film varies toward the thinner direction. A solid line 603 indicates a spectral characteristic at the time when the antireflective film varies toward the thicker direction. When the antireflective film is designed in accordance with the conventional technique, a point 604 where the spectral curve at the time when the film thickness of the antireflective film varies toward the thinner direction and the spectral curve at the time when the film thickness of the antireflective film varies toward the thicker direction of the antireflective film intersect with each other exists at a wavelength near to 550 nm. At the cross point, changing directions on the blue side and the red side reverse. Consequently, when a variation is produced in film thicknesses, the transmittance at a point G (550 nm) does not change so much, but the transmittances at points B (450 nm) and R (630 nm) change greatly. Consequently, large differences of values of color ratios B/G and R/G are produced, and the differences make the color reproducibility bad.

On the basis of the circumstances described above, the present inventor varied film thicknesses of the insulation films and the antireflective films, and examined them. Consequently, the inventor found that the film thicknesses of the insulation films and the antireflective films could be set in order that the changing directions of the spectral transmittances might be the same at the peak wavelength of the color filter on the side of the shortest wavelength and on the side of the longest wavelength after the transmission of an infrared cutting filter. To put it more concretely, the inventor found that the changing directions of the spectral transmittances were the same when the film thickness of a silicon oxide film used as the insulation film is 8 nm or less and the film thickness of a silicon nitride film used as the antireflective film is within a range from 25 nm to 40 nm. Moreover, the inventor also found that the changing directions of the spectral transmittances were the same when the film thickness of a silicon oxide film used as the insulation film is 8 nm or less and the film thickness of a silicon oxynitride film used as the antireflective film is within a range from 40 nm to 60 nm.

Figure 1:
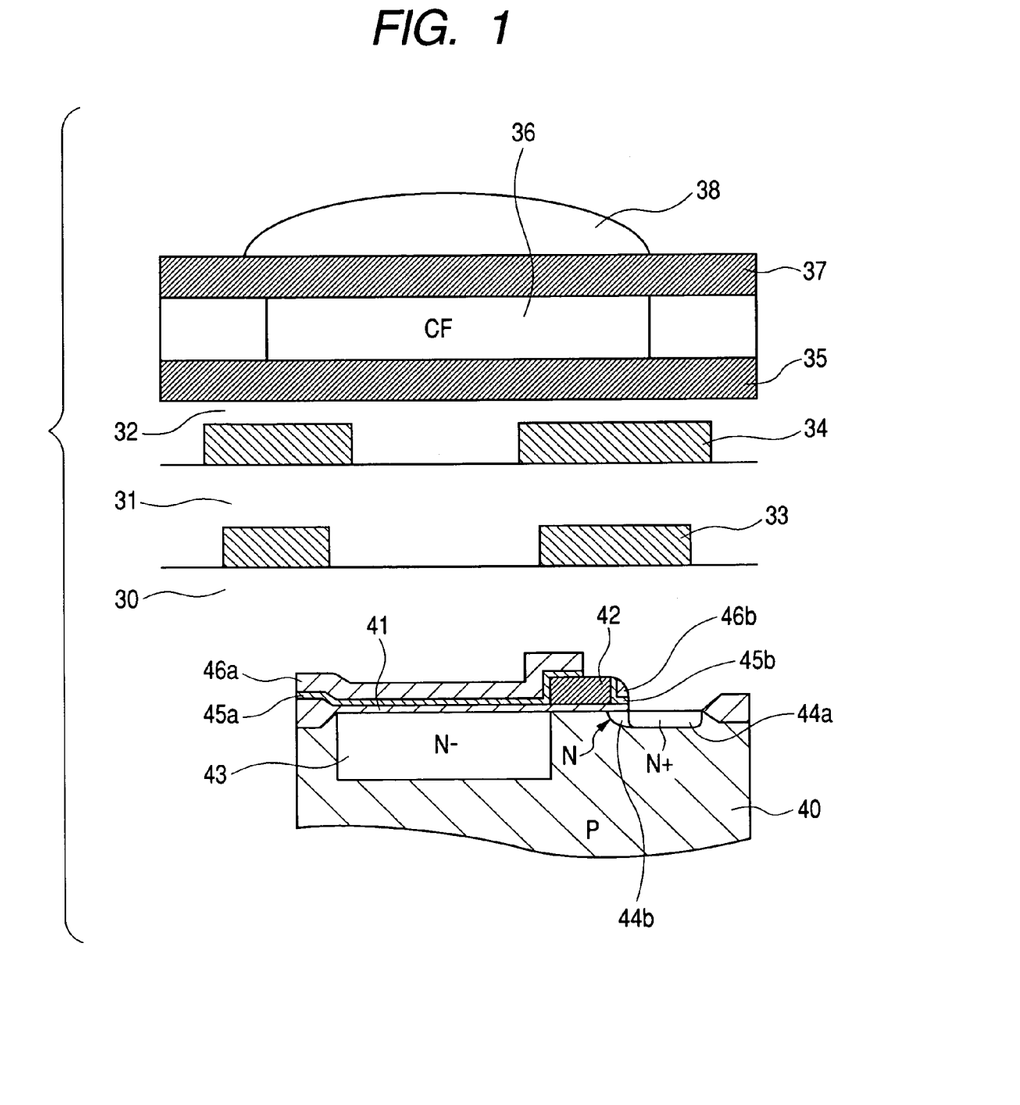
FIG. 1 is a view showing the configuration of a photoelectric conversion apparatus of an embodiment of the present invention.

FIG. 1 shows the configuration of a photoelectric conversion apparatus of the present embodiment. The photoelectric conversion apparatus of the present embodiment adopts a configuration made by providing an Al wiring layer 33 above the solid state image pickup apparatus of the Japanese Patent Application Laid-Open No. 2000-12822, shown in FIG. 9, with an interlayer film ($SiO_2$) 30 put between them, and by providing an Al wiring layer 34 above the Al wiring layer 33 with an interlayer film ($SiO_2$) 31 put between them, and further by providing a flattening layer 35, a color filter (CF) layer 36 and a flattening layer 37 above the Al wiring layer 34 with an interlayer film ($SiO_2$) 32 put between them. The photoelectric conversion apparatus is further provided with a microlens 38. The same configuration members as those of the solid state image pickup apparatus of FIG. 9 are here denoted by the same reference marks as those in FIG. 9, and their descriptions are omitted.

However, in the case where the decrease of the reflection light should be first considered rather than the problems pertaining to processes such as the increase of dark currents in pixels and the increase of white spots, the insulation film 41 is not always formed on the light receiving portion 43. This fact is applied to all of the examples described in the following.

Figure 2:
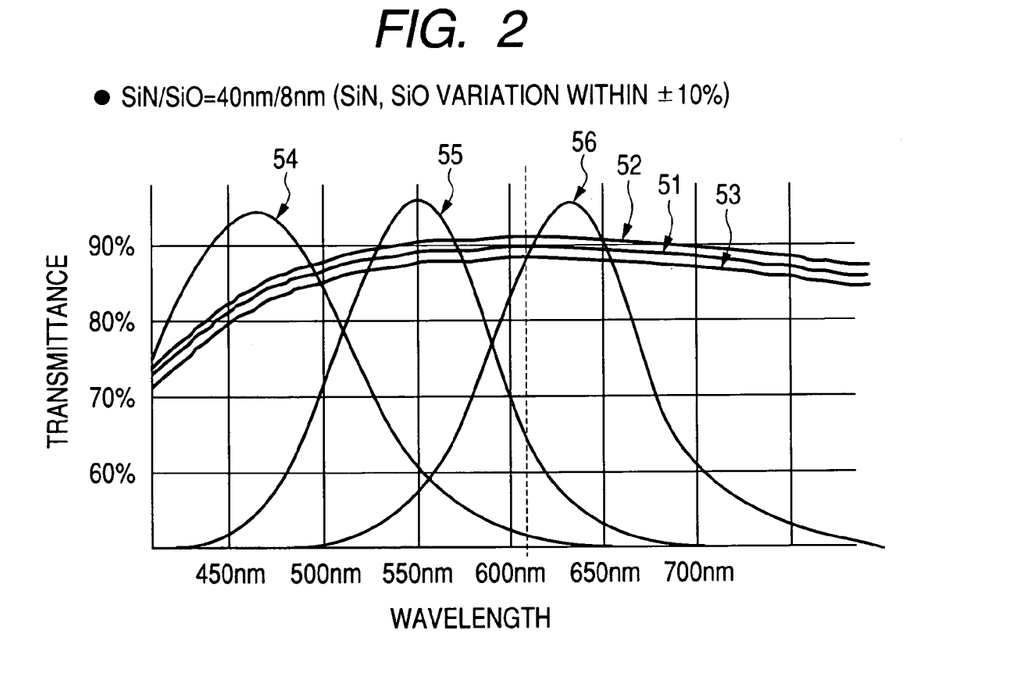
FIG. 2 is a characteristic diagram of spectral transmittances in the case where the film thickness of a silicon oxide film as an insulation film is 8 nm and the film thickness of a silicon nitride film as an antireflective film is 40 nm.
Figure 3:
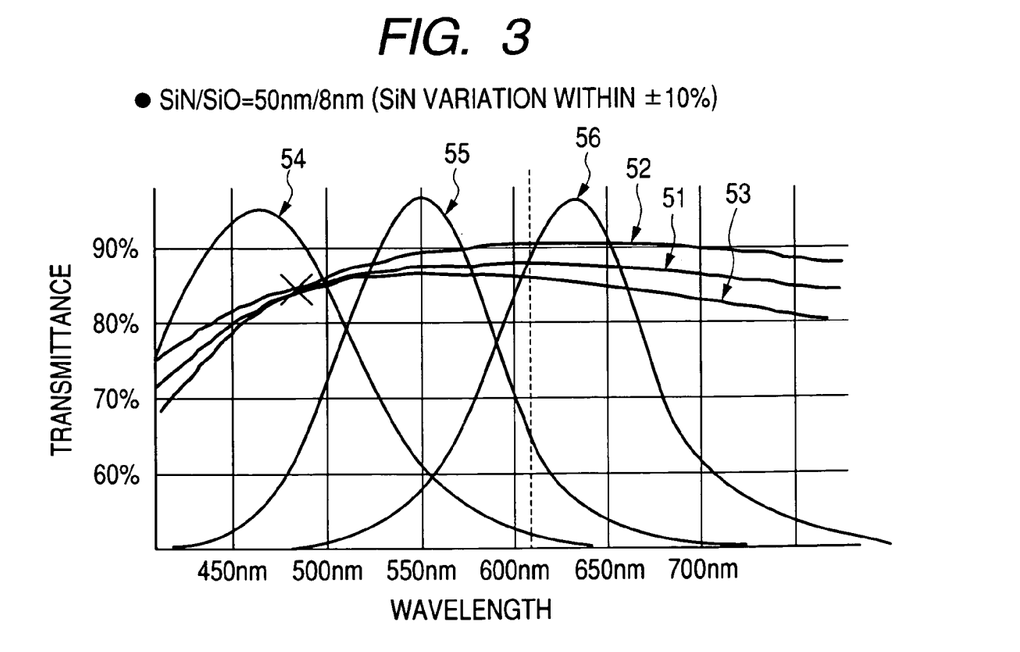
FIG. 3 is a characteristic diagram of spectral transmittances as a first comparative example in the case where the film thickness of a silicon oxide film as an insulation film is 8 nm and the film thickness of a silicon nitride film as an antireflective film is 50 nm.
Figure 4:
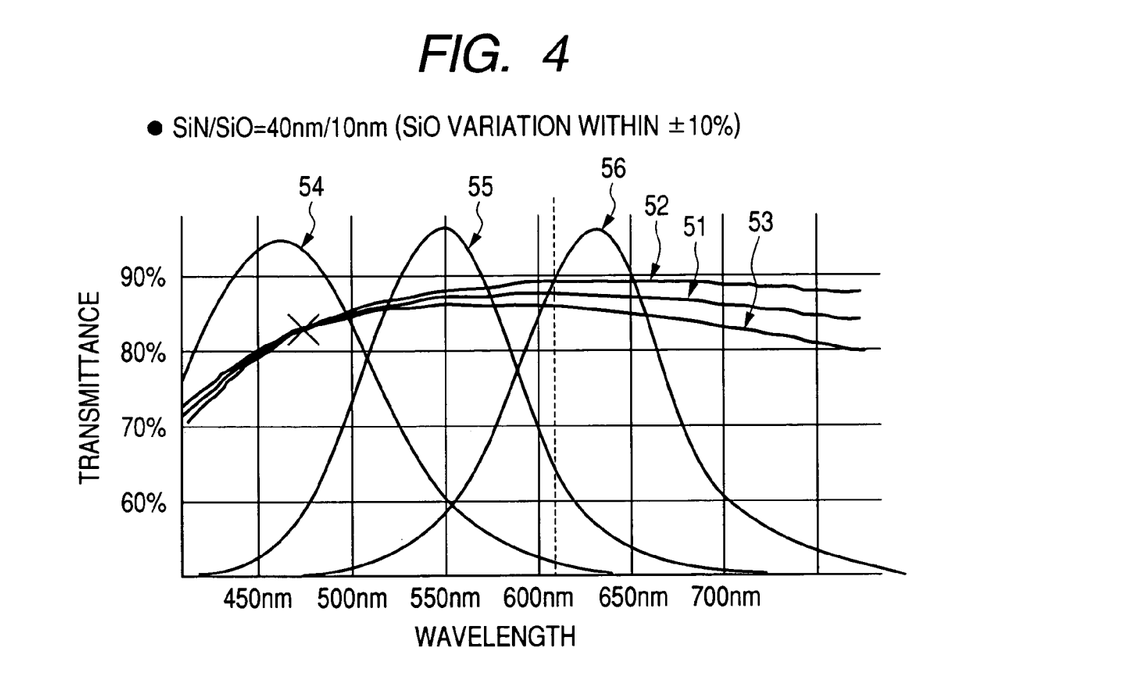
FIG. 4 is a characteristic diagram of spectral transmittances as a second comparative example in the case where the film thickness of a silicon oxide film as an insulation film is 10 nm and the film thickness of a silicon nitride film as an antireflective film is 40 nm.

FIG. 2 is a spatial transmittance characteristic diagram of an embodiment of the present invention, in which the thicknesses of the insulation film and the antireflective film are within the above-mentioned range. That is to say, FIG. 2 shows the spectral transmittances in the case where the thickness of a silicon oxide film as the insulation film is 8 nm and the thickness of a silicon nitride film as the antireflective film is 40 nm. FIG. 3 is a spectral transmittance characteristic diagram as a first comparative example, in which the thickness of the silicon oxide film as the insulation film is 8 nm and the thickness of the silicon nitride film as the antireflective film is 50 nm. FIG. 4 is a spectral transmittance characteristic diagram as a second comparative example, in which the thickness of the silicon oxide film as the insulation film is 10 nm and the thickness of the silicon nitride film as the antireflective film is 40 nm. A reference numeral 51 denotes a spectral characteristic in the case where the antireflective film has a designed thickness value. A reference numeral 52 denotes a spectral characteristic in the case where the antireflective film becomes thicker by 10% owing to a variation. A reference numeral 53 denotes a spectral characteristic in the case where the antireflective film becomes thinner by 10% owing to a variation. A reference numeral 54 denotes a spectral characteristic of a blue color filter. A reference numeral 55 denotes a spectral characteristic of a green color filter. A reference numeral 56 denotes a spectral characteristic of a red color filter after the transmission of an infrared cutting filter. The peak wavelengths of the respective filters are 450 nm, 550 nm and 630 nm in the blue color filter, the green color filter and the red color filter, respectively.

As shown in FIG. 2, as long as the film thicknesses of the insulation film and the antireflective film are within the above-mentioned range of the embodiment of the present invention, the changing directions of the spectral characteristics between the peak wavelengths of 450 nm and 630 nm of the blue color filter and the red color filter, respectively, are the same. On the other hand, as shown in FIGS. 3 and 4, in the case where the film thicknesses of the insulation film and the antireflective film are out of the above-mentioned range of the embodiment of the present invention, it can be found that the changing directions of the spectral characteristics between the peak wavelengths of 450 nm and 630 nm of the blue color filter and the red color filter, respectively, are not the same, and that the changing directions of the blue side and the red side are reversed.

EXAMPLE 1

Figure 5:
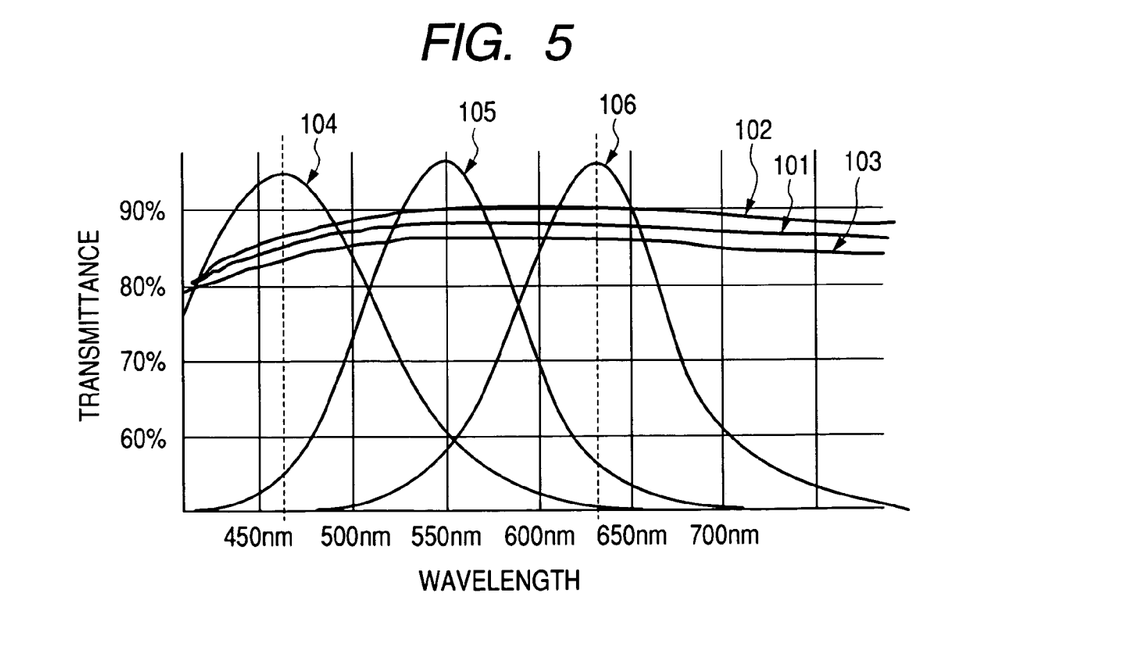
FIG. 5 is a diagram showing a designing technique according to a first example of the present invention.

In accordance with claim 1 of the present invention, after the insulation film of the photoelectric conversion apparatus of FIG. 1 was formed to be 8 nm thick as a silicon oxide film and the antireflective film was formed to be 30 nm thick as a silicon nitride film, wiring layers were formed. Thereby, a photoelectric conversion apparatus including formed color filter layers of red, green and blue was made. The present example was made to have a variation in the antireflective film. FIG. 5 shows a spectral characteristic of the present example. A reference numeral 101 denotes a spectral characteristic in the case where the antireflective film takes a designed value (30 nm). A reference numeral 102 denotes a spectral characteristic in the case where the antireflective film is thicker by 10% (33 nm) owing to a variation. A reference numeral 103 denotes a spectral characteristic in the case where the antireflective film is thinner by 10% (27 nm) owing to a variation. A reference numeral 104 denotes the spectral characteristic of the blue color filter. A reference numeral 105 denotes the spectral characteristic of the green color filter. A reference numeral 106 denotes the spectral characteristic of the red color filter after the transmission of an infrared cutting filter. The peak wavelength of each filter of blue, green and red is: 450 nm, 550 nm and 630 nm, respectively.

The spectral characteristics of the photoelectric conversion apparatus made under the above-mentioned conditions are ones shown in FIG. 5. The spectral characteristics has a feature such that the changing directions of the spectral characteristic (102) in the case where the antireflective film is thicker by 10% and the spectral characteristic (103) in the case where the antireflective film is thinner by 10% are the same between the peak wavelength 450 nm of blue and the peak wavelength 630 nm of red. This tendency was especially notable when the film thickness of the antireflective film was within a range from 25 nm to 40 nm. In the case where the silicon oxide film was not provided below the antireflective film, also the same tendency was exhibited.

Table 2 shows variations of color ratios of a sensor made by the technique of Example 1. (It is supposed that B=450 nm, G=550 nm and R=630 nm.) Ten chips were randomly extracted, and the values of B/G and R/G of each chip were measured. The standard deviation values σ of the ten chips were obtained to the respective R/G and B/G. By the technique of Example 1, the variation of the B/G was 0.99% when being expressed by σ, and the variation of the R/G was 0.94% when being expressed by σ.

TABLE 2

| CHIP | B/G | R/G |
|------|--------|--------|
| 1 | 1.01 | 1.00 |
| 2 | 1.00 | 0.99 |
| 3 | 1.00 | 1.01 |
| 4 | 0.99 | 1.00 |
| 5 | 0.98 | 1.02 |
| 6 | 1.01 | 1.00 |
| 7 | 1.00 | 0.99 |
| 8 | 1.01 | 0.99 |
| 9 | 1.00 | 1.00 |
| 10 | 0.99 | 1.00 |
| σ | 0.0099 | 0.0094 |

Because the changing directions of the spectral transmissions are the same between the peak wavelength of blue and the peak wavelength of red by the technique of Example 1, the color ratio that by the improved by 3% in comparison with that by the conventional technique (Table 1). Consequently, a photoelectric conversion apparatus having better color reproducibility in comparison with the one by the conventional technique was realized.

EXAMPLE 2

Figure 6:
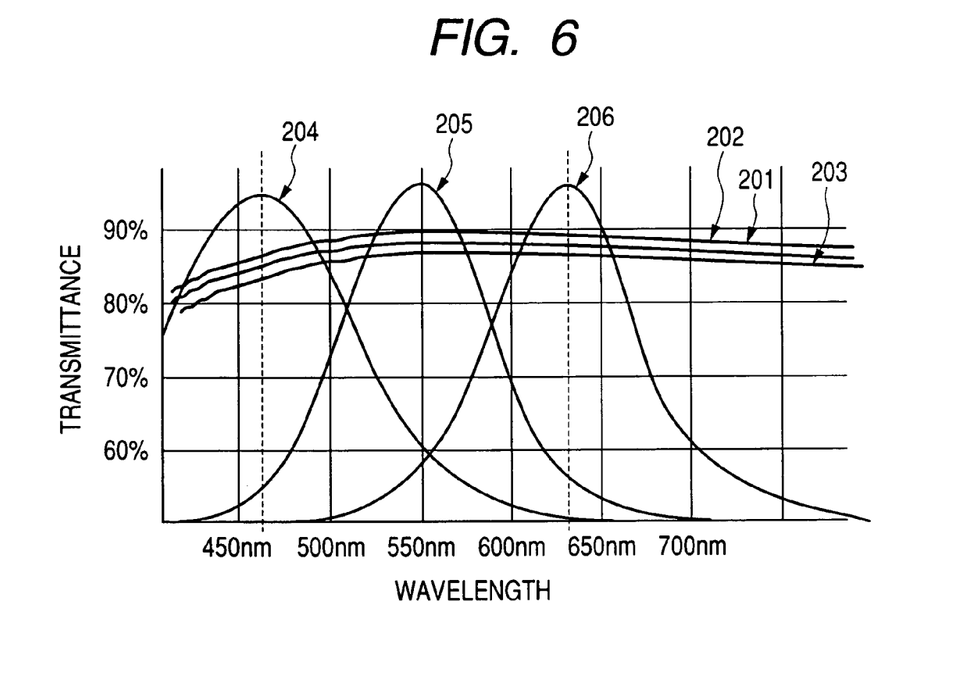
FIG. 6 is a diagram showing a designing technique according to a second example of the present invention.

In accordance with claim 1 of the present invention, after the insulation film of the photoelectric conversion apparatus of FIG. 1 was formed to be 8 nm thick as a silicon oxide film and the antireflective film was formed to be 30 nm thick as a silicon nitride film, wiring layers were formed. Thereby, a photoelectric conversion apparatus including formed color filter layers of red, green and blue was made. The present example was made to have a variation in the insulation film. FIG. 6 shows a spectral characteristic of the present example. A reference numeral 201 denotes a spectral characteristic in the case where the insulation film takes a designed value (8 nm). A reference numeral 202 denotes a spectral characteristic in the case where the insulation film is thicker by 10% owing to a variation. A reference numeral 203 denotes a spectral characteristic in the case where the insulation film is thinner by 10% owing to a variation. A reference numeral 204 denotes the spectral characteristic of the blue color filter. A reference numeral 205 denotes the spectral characteristic of the green color filter. A reference numeral 206 denotes the spectral characteristic of the red color filter after the transmission of an infrared cut filter. The peak wavelength of each filter of blue, green and red is: 450 nm, 550 nm and 630 nm, respectively.

The spectral characteristics of the photoelectric conversion apparatus made under the above-mentioned conditions are ones shown in FIG. 6. The spectral characteristics has a feature such that the changing directions are the same between the peak wavelength 450 nm of blue and the peak wavelength 630 nm of red even if the insulating films were varied. This tendency was especially notable when the film thickness of the insulating film was within a range from 6 nm to 8 nm. In the case where the silicon oxide film was not provided below the antireflective film, also the same tendency was exhibited.

Table 3 shows variations of color ratios of a sensor made by the technique of Example 2. (It is supposed that B=450 nm, G=550 nm and R=630 nm.) Ten chips were randomly extracted, and the values of B/G and R/G of each chip were measured. The standard deviation values σ of the ten chips were obtained to the respective R/G and B/G. By the technique of Example 2, the variation of the B/G was 0.57% when being expressed by σ, and the variation of the R/G was 0.67% when being expressed by σ.

TABLE 3

| CHIP | B/G | R/G |
|------|--------|--------|
| 1 | 1.00 | 1.00 |
| 2 | 1.00 | 0.99 |
| 3 | 1.00 | 1.00 |
| 4 | 0.99 | 1.00 |
| 5 | 1.00 | 1.00 |
| 6 | 1.01 | 1.00 |
| 7 | 1.00 | 1.01 |
| 8 | 1.00 | 0.99 |
| 9 | 0.99 | 1.00 |
| 10 | 1.00 | 1.01 |
| σ | 0.0057 | 0.0067 |

Because the changing directions of the spectral transmissions are the same between the peak wavelenght of blue and the peak wavelength of red by the technique of Example 2, the color ratio variations were improved by 3.5% or more in comparison with those by the conventional technique (Table 1). Consequently, a photoelectric conversion apparatus having better color reproducibility in comparison with the one by the conventional technique was realized.

EXAMPLE 3

Figure 7:
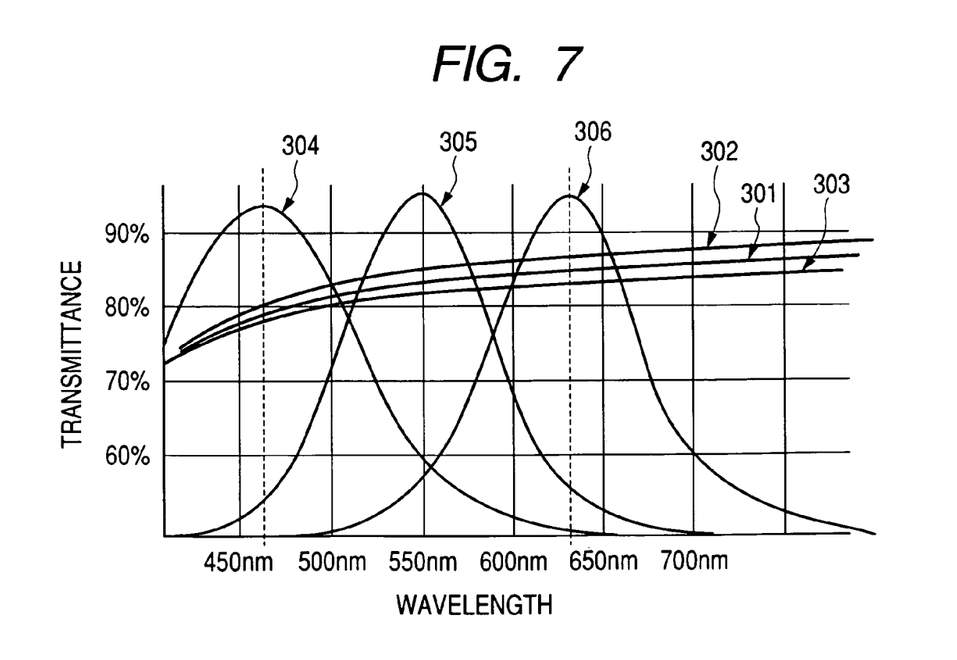
FIG. 7 is a diagram showing a designing technique according to a third example of the present invention.

In accordance with claim 1 of the present invention, the insulation film of the photoelectric conversion apparatus of FIG. 1 was formed to be 8 nm thick as a silicon oxide film (n=1.66), and the antireflective film was formed to be 50 nm thick as a silicon oxynitride film. After that, wiring layers were formed. Thereby, a photoelectric conversion apparatus including formed color filter layers of red, green and blue was made. The present example was made to have variations in the antireflective film and in the insulation film. FIG. 7 shows spectral characteristics of the present example. A reference numeral 301 denotes a spectral characteristic in the case where the antireflective film takes a designed value. A reference numeral 302 denotes a spectral characteristic in the case where the antireflective film and the insulation film are severally thicker by 10% owing to a variation. A reference numeral 303 denotes a spectral characteristic in the case where the antireflective film and the insulation film are severally thinner by 10% owing to a variation. A reference numeral 304 denotes the spectral characteristic of the blue color filter. A reference numeral 305 denotes the spectral characteristic of the green color filter. A reference numeral 306 denotes the spectral characteristic of the red color filter. The peak wavelength of each filter of blue, green and red is: 450 nm, 550 nm and 630 nm, respectively.

The spectral characteristics of the photoelectric conversion apparatus made under the above-mentioned conditions are ones shown in FIG. 7. The spectral characteristics has a feature such that the changing directions of the spectral characteristic (302) in the case where the antireflective film and the insulation film are thicker by 10% and spectral characteristic (303) in the case where the antireflective film and the insulation film are thinner by 10% are the same between the peak wavelength 450 nm of blue and the peak wavelength 630 nm of red. This tendency was especially notable when the film thickness of the insulation film was within a range from 6 nm to 8 nm and the antireflective film was within a range from 40 nm to 60 nm. In the case where the silicon oxide film was not provided below the antireflective film, also the same tendency was exhibited.

Table 4 shows variations of color ratios of a sensor made by the technique of Example 3. (It is supposed that B=450 nm, G=550 nm and R=630 nm.) Ten chips were randomly extracted, and the values of B/G and R/G of each chip were measured. The standard deviation values σ of the ten chips were obtained to the respective R/G and B/G. By the technique of Example 3, the variation of the B/G was 1.60% when being expressed by σ, and the variation of the R/G was 1.42% when being expressed by σ.

TABLE 4

| CHIP | B/G | R/G |
| --- | --- | --- |
| 1 | 1.02 | 0.98 |
| 2 | 1.00 | 0.99 |
| 3 | 0.98 | 1.01 |
| 4 | 0.99 | 1.01 |
| 5 | 1.00 | 1.00 |
| 6 | 1.01 | 0.98 |
| 7 | 1.03 | 0.97 |
| 8 | 1.00 | 0.99 |
| 9 | 0.98 | 1.01 |
| 10 | 1.00 | 0.99 |
| σ | 0.0160 | 0.0142 |

Because the changing directions of the spectral transmissions are the same between the peak wavelength of blue and the peak wavelength of red by the technique of Example 3, the color ratio variations were improved by 3.5% or more in comparison with those by the conventional technique (Table 1) when being expressed by σ. Consequently, a photoelectric conversion apparatus having better color reproducibility in comparison with the one by the conversional technique was realized.

Figure 8:
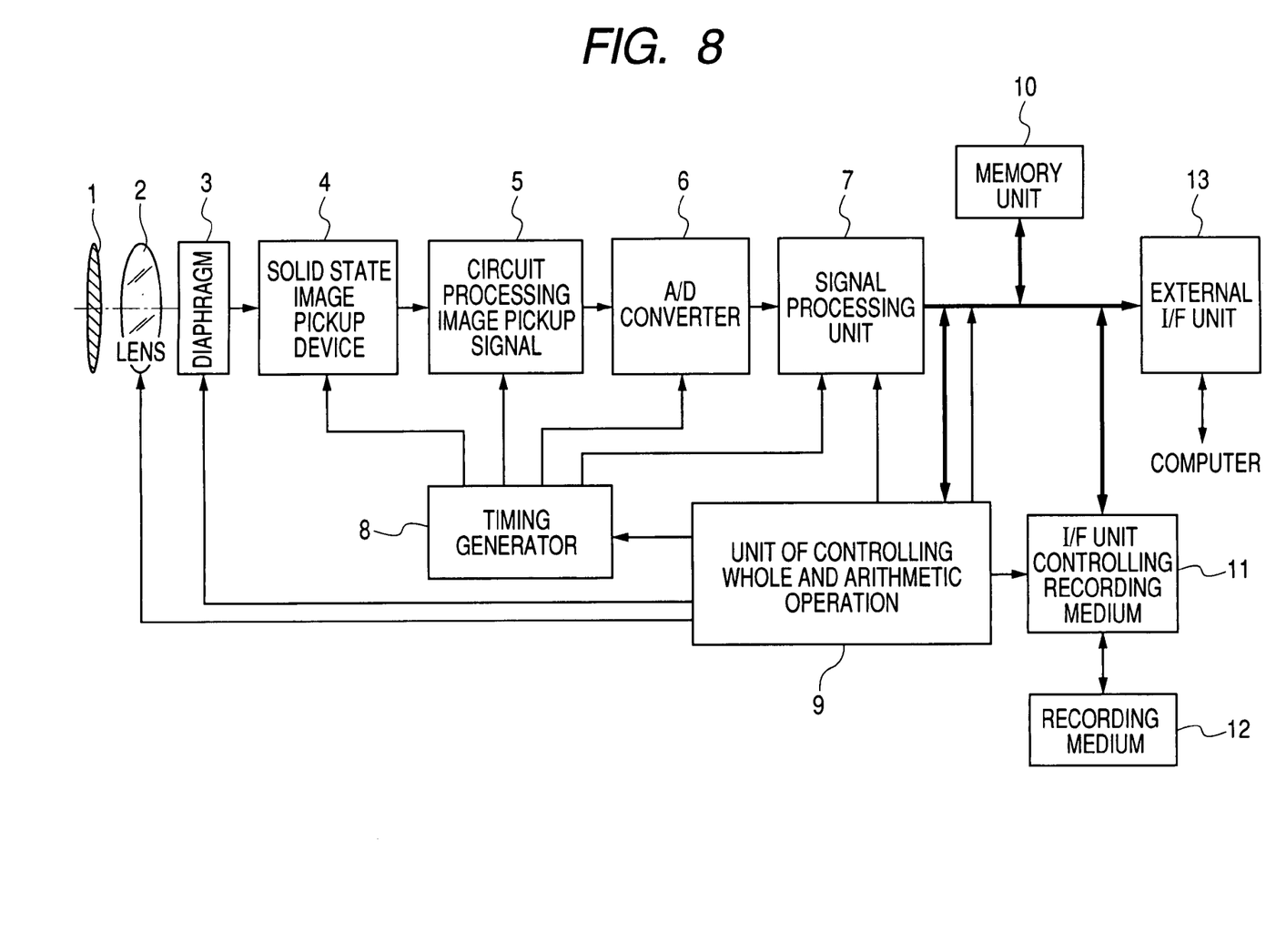
FIG. 8 is a block diagram showing a case where a solid state image pickup apparatus of the present invention is applied to a still video camera.

Next, an image pickup system using the above-mentioned photoelectric conversion apparatus is described. Referring to FIG. 8, the details of an embodiment in which the solid state image pickup device of the present invention is applied to a still camera are described.

FIG. 8 is a block diagram showing a case where the solid state image pickup device is applied to a "still video camera."

In FIG. 8, a reference numeral 1 denotes a barrier used as a protection of a lens and also used as a main switch. A reference numeral 2 denotes a lens for forming an optical image of a subject on a solid state image pickup device 4. A reference numeral 3 denotes a diaphragm for changing the amount of light passing through the lens 2. The reference numeral 4 denotes the solid state image pickup device for taking the subject imaged by the lens 2 as an image signal. A reference numeral 5 denotes a circuit processing image pickup signal. A reference numeral 6 denotes an A/D converter for performing the analog-digital conversion of an image signal output from the solid state image pickup device 4. A reference numeral 7 denotes a signal processing unit for performing various corrections of the image data output from the A/D converter 4 and for performing the compression of the data. A reference numeral 8 denotes a timing generator for outputting various timing signals to the solid state image pickup device 4, the circuit 5 processing image pick-up signal, the A/D converter 6 and the signal processing unit 7. A reference numeral 9 denotes a unit of controlling whole and arithmetic operation for controlling various operations and the whole of the still camera. A reference numeral 10 denotes a memory unit for storing image data temporarily. A reference numeral 11 denotes an interface unit for performing the recording or the reading of a recording medium. A reference numeral 12 denotes the detachably mountable recording medium such as a semiconductor memory for performing the recording or the reading of image data. A reference numeral 13 denotes an interface unit for performing the communication with an external computer or the like.

Next the operation of the still video camera configured as above at the time of photographing is described.

When the barrier 1 is opened, the main power source is turned on. Next, the power source of the control system is turned on. Furthermore, the power source of the image pickup system circuits such as the A/D converter 6 is turned on.

Then, the unit of controlling whole and arithmetic operation 9 releases the diaphragm 3 for controlling light exposure. A signal output from the solid state image pickup device 4 is converted by the A/D converter 6, and then is input to the signal processing unit 7. According to the data of the signal processing unit 7, the unit of controlling whole and arithmetic operation 9 performs the operation of an exposure.

The unit of controlling whole and arithmetic operation 9 judges brightness on the basis of a result of performing the photometry, and controls the diaphragm 3 according to the result of the judgment.

Next, the unit of controlling whole and arithmetic operation 9 extracts high frequency components on the basis of the signal output from the solid state image pickup device 4, and performs the arithmetic operation of the distance from the still video camera to a subject. After that, the unit of controlling whole and arithmetic operation 9 drives the lens, and judges whether to be focused or not. When the unit of controlling whole and arithmetic operation 9 judges that the lens is not focused, the unit of controlling whole and arithmetic operation 9 again drives the lens and performs distance measuring.

After a focused state has been confirmed, the still video camera begins an actual exposure. When the exposure has been completed, an image signal output from the solid state image pickup device 4 receives an A/D conversion by the A/D converter 6. Then, the converted digital data passes through the signal processing unit 7 to be written in the memory unit by the unit of controlling whole and arithmetic operation 9.

After that, the data stored in the memory unit 10 is recorded in the detachably mountable recording medium 12 such as a semiconductor memory through the I/F unit for controlling recording medium under the control of the unit of controlling whole and arithmetic operation 9. Alternatively, the data stored in the memory unit 10 can be directly input to a computer or the like through the external I/F unit 13.

The present invention can be applied to an apparatus using an image pickup apparatus (photoelectric conversion apparatus) mounting a color filter such as a video camera and a still camera.

What is claimed is:

1. A method of designing antireflective films for a photoelectric conversion apparatus that includes a plurality of light receiving portions, an antireflective film arranged on each of said plurality of light receiving portions, and color filter layers of a plurality of colors arranged on each of said antireflective films, said method comprising steps of:

determining a thickness range of antireflective films,
wherein a transmittance of a relatively thin antireflective film within said thickness range and a transmittance of a relatively thick antireflective film within said thickness range has a constant relationship over a range of wavelengths, and
wherein said range of wavelengths includes wavelengths corresponding to a plurality of color filters; and designing an antireflective film to be used in a photoelectric conversion apparatus based on said thickness range determined in said determining step.

2. The method according to claim 1, wherein said plurality of color filters includes a blue filter corresponding to a shortest wavelength within said range of wavelengths and a red filter corresponding to a longest wavelength of said range of wavelengths.

3. The method according to claim 1, wherein said constant relationship is such that, over said range of wavelengths, said transmittance of said relatively thick antireflective film is either always greater than or always less than said transmittance of said relatively thin antireflective film.

4. The method according to claim 1, wherein said range of wavelengths is from about 450 nm to about 630 nm.

* * * * *